United States Patent [19]

Le Can et al.

[11] 4,203,042
[45] May 13, 1980

[54] INTEGRATED CIRCUIT

[75] Inventors: Claude J. P. F. Le Can, Beek; Johannes A. C. van den Beemt, Nijmegen, both of Netherlands

[73] Assignee: U.S. Philips Corporation, New York, N.Y.

[21] Appl. No.: 847,161

[22] Filed: Oct. 31, 1977

[30] Foreign Application Priority Data

Nov. 4, 1976 [NL] Netherlands ................ 7612222

[51] Int. Cl.$^2$ .............. H03K 17/56; H03K 19/08; H03K 19/20; G11C 19/28
[52] U.S. Cl. .............................. 307/241; 307/213; 307/216; 307/221 R; 307/242; 307/243; 307/244; 357/92
[58] Field of Search ............... 307/203, 207, 216, 239, 307/241, 242, 243, 244, 215, 299 B, 221 R; 357/92

[56] References Cited

U.S. PATENT DOCUMENTS

| | | | |
|---|---|---|---|
| 3,235,840 | 2/1966 | Sturm | 307/243 X |
| 3,551,900 | 12/1970 | Annis | 307/244 X |
| 3,601,631 | 8/1971 | Miller | 307/209 |
| 3,731,073 | 5/1973 | Moylan | 307/207 X |
| 3,855,484 | 12/1974 | Essen et al. | 357/92 X |
| 3,992,703 | 11/1976 | Luisi et al. | 307/243 X |
| 3,993,918 | 11/1976 | Sinclair | 357/92 X |
| 4,053,793 | 10/1977 | Ernst et al. | 307/207 |
| 4,056,736 | 11/1977 | Blatt | 307/207 X |
| 4,084,105 | 4/1978 | Teranishi et al. | 307/207 X |

OTHER PUBLICATIONS

Robbins; "MTL Exclusive OR circuit"; *IBM Tech. Discl. Bull.;* vol. 19, No. 6, p. 2077; 11/1976.
Higby, Jr.; "Parity Check Circuit"; *IBM Tech. Discl. Bull;* vol. 1, No. 6; pp. 9–10; 4/1959.

*Primary Examiner*—Larry N. Anagnos
*Attorney, Agent, or Firm*—Thomas A. Briody; Jack Oisher; James J. Cannon, Jr.

[57] ABSTRACT

Four-pole circuit modules constructed in integrated injection logic (I$^2$L), each four-pole circuit having two signal inputs, a control input, and a signal output line. The signal output line is alternatively connected to one of the signal inputs by each of the two values of a bivalent control signal. This two-level logic can be used in multiplexers in which the four-pole circuits are successively arranged in two or more levels. A shift register composed of master-slave flipflops is obtained by connecting the signal output lines of a series of four-pole circuit modules to one of the signal input lines of the respective four-pole circuit modules and to a signal input line of the next four-pole circuit. Four-pole circuits can be arranged in a series with common control and different combinations of input signals in order to form an arithmetic member for one bit per input quantity.

The four-pole circuit module is very suitable for computer-aided design (CAD), due to the advantageous location of the connection points and that small modifications in the geometry of the modular four-pole circuit modules implicitly realize additional inversion operations. The four-pole circuit module is modified to form a comparison circuit or an EXCLUSIVE-OR generator by other modifications.

19 Claims, 23 Drawing Figures

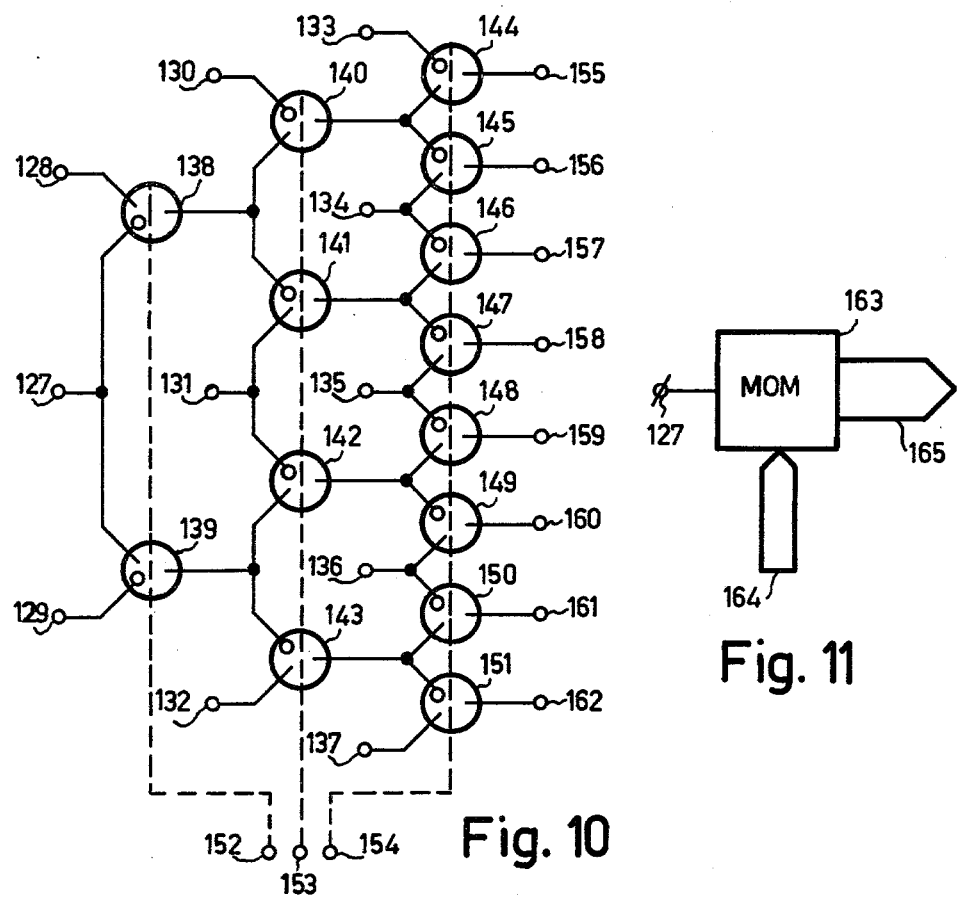
Fig. 10
Fig. 11
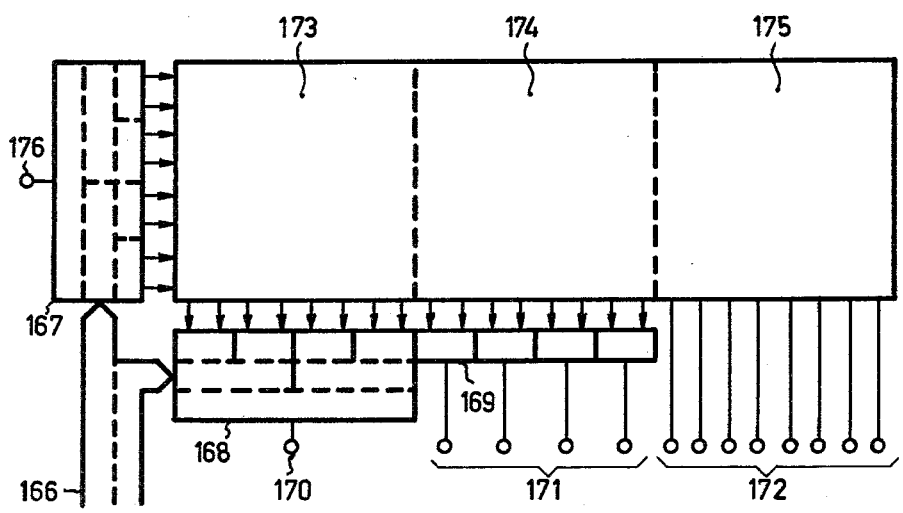
Fig. 12

| 209 | 210 | 211 | 228 |
|---|---|---|---|
| 0 | 0 | 0 | S2 |
| 0 | 0 | 1 | S1 |
| 0 | 1 | 0 | A.B |
| 0 | 1 | 1 | B |
| 1 | 0 | 0 | $\overline{A}$ |
| 1 | 0 | 1 | $\overline{A + B}$ |
| 1 | 1 | 0 | A ⊕ B |
| 1 | 1 | 1 | S0 |

INTEGRATED CIRCUIT

BACKGROUND OF THE INVENTION

1. Field of the Invention

The invention relates to an integrated circuit for performing logic operations on at least three input signals which appear together on inputs of the circuit, said circuit comprising at least one current injector provided with a supply electrode for receiving a supply current. A "current injector" is to be understood to mean herein a multi-layer structure, constructed according to semiconductor technology, comprising at least three layers which are separated from each other by rectifying transitions. Therein, a first, injecting layer is provided with a supply current connection and is separated from the circuit element (elements) to be powered by at least one rectifying transition. Furthermore, a neighbouring second or intermediate layer of semiconductor material which also comprises a supply current connection is provided, so that the connection of a supply current source between said supply current connections (with a polarity which corresponds to the polarity of the rectifying transition between the layers connected thereto) controls an injection of a flow of charge carriers from the injecting to the intermediate layer. Finally, charge carriers are collected in a subsequent, collecting layer of the series of layers of the current injector structure and controlled, via a rectifying transition between said collecting layer and a preceding layer of the current injector structure. One zone of one of the circuit elements to be powered, to be referred to as the zone to be set, which is separated from the injecting layer and its supply current connection by at least two rectifying transitions, is capable of collecting charge carriers from one of the layers of the current injector structure via a rectifying transition which bounds this zone, said zone thus being powered and being connected directly to a pattern of conductor tracks.

2. Description of the Prior Art

A structure of this kind is known as integrated injection logic ($I^2L$) and is described in the previous U.S. Patent Application Ser. No. 876,219 in the name of Applicant. The advantages of this structure are extensively described therein and inter alia concern a simple construction and the substantially complete absence of adjusting resistors. Furthermore, there are only few conductor tracks, which enables a compact construction. It is also possible to operate a large number of transistors by means of one and the same current injector, and hence accurately with the same currents. In many cases this is advantageous; for example, if mutually equal switching times of parallel operating elements are required, said switching times being dependent on the supply current. Circuits of this kind also result in technologically attractive manufacturing methods.

Circuits of this kind are frequently used, the aim being for an increasing number of circuit elements per semiconductor body, for example, microprocessors. Circuits of this kind are constructed with elementary components in the form of logic gates which perform AND, OR, NAND, NOR and possibly other logic functions. The inputs of gates of this kind usually have the same rank relative to each other, while a single logic function output is provided, possibly in combination with an output which is inverted with respect thereto.

SUMMARY OF THE INVENTION

The invention has for its object to provide a system which is feasible for computer aided design. In this respect, said gates often give rise to problems, which is the reason why even the term "wild logic" has come into use. The invention takes into account the fact that in many digital devices a very large number of internal data transports must take place. Therefore, the invention has for its object to provide a system which can be readily designed in the case of such a large number of signal transports, via BUS-lines or not. The essential importance of ease of design and the minimum area of the circuit to be achieved thereby is illustrated by the fact that in some known circuits up to 50% of the surface area is occupied by signal connections between the sections of the circuit. The invention has for its object to provide a system for which a limited library of cells suffices, which cells have been optimized in advance, and to use the cells a large number of times in the circuit. The invention has for its object to enable the use of a single cell for a large number of applications within an integrated circuit, for data transports as well as for the implementation of logic functions.

The objects in accordance with the invention are achieved in that circuit elements of the circuit, powered by a current injector, comprise four-pole circuits which are arranged as selection switches in modular form, for each four-pole circuit there being provided three signal connections, that is, two signal input lines and one signal output line; for each pole circuit there furthermore being provided one control line, each of the two voltage levels of a bivalent control signal, received on a control line of a four-pole circuit, alternatively connecting the signal output line of its respective four-pole circuit to one of the two signal input lines of its respective four-pole circuit. As will appear from the following description, the advantages of the invention are utilized by the modular, mutiple use of said four-pole circuits, or by even constructing given circuit elements exclusively from these four-pole circuits.

Preferably, these circuit elements are linked to form one-dimensionsional or two-dimensional arrays. The connection between a signal input line and a signal output line can in first instance still be of a physical nature. On the other hand, this connection may also be of an exclusively logical nature, for example, in that always corresponding current-conductive states are present without direct interconnection, or even in that, for example, inversion occurs automatically. The use of current injectors is particularly advantageous in this respect, as a result of the well-defined logic states then occurring; this is because the current is always present and logic intermediate states, as occurring in the case of voltage-governed logic, are very unlikely to occur.

Preferably, at least one signal connection of at least two of said four-pole circuits is interconnected. As a result of this configuration, said four-pole circuits can be used in parallel as well as serially, depending on whether similar or dissimilar signal connections are interconnected. The required number of external connections is thus reduced, while flexibility of connection is maintained. A varied configuration is thus possible, while the structure remains simple; this is a very desirable aspect for the machine-aided design of a circuit.

Preferably, two of three said four-pole circuits have a signal connection of a first kind connected to a signal connection of the second kind of the third four-pole circuit, said two four-pole circuits having their control lines interconnected but separate from the control line of the third four-pole circuit in order to form a multiplexer having two selection levels. If one signal output line is connected to two signal input lines of different four-pole circuits, distribution via a specified output connection is possible. If the signal output lines of two different four-pole circuits are connected to the two signal output lines of the third four-pole circuit, selective conduction of a selected input signal can be realized. Attractive multiplexer functions can thus be realized.

Preferably, the signal output line of a first four-pole circuit is connected to a control line of a second four-pole circuit. The interchange of data signals and control signals is readily possible when use is made of integrated injection logic for the four-pole circuits, because the logic levels of both correspond to the same electronic levels. Thus, no additional transformation circuit is required.

For the formation of a majority circuit as regards three input signals, a circuit is preferably provided for forming an EXCLUSIVE-OR function of two input signals, the signal of said function controlling a four-pole circuit which receives on its signal input lines one of said two input signals and the third input signal, respectively. The use of majority logic offers advantages in many applications and can be readily implemented.

For the formation of a series shift register from a series of at least 2n of said four-pole circuits, all four-pole circuits preferably have their signal output line connected exclusively to one signal input line of their own and to one signal input line of the next four-pole circuit of the series, a control device being provided for alternately connecting the signal output line of the even and the odd four-pole circuits of the series of the signal output line of the preceding four-pole circuit of the series. As a result of such a link, a shift register composed of master-slave (MS) flipflops is obtained in a very attractive manner. On the other hand, two four-pole circuits can form a single MS-flipflop.

Preferably, all control lines of a series of parallel-connected four-pole circuits are interconnected, the respective signal input lines receiving at least three different logic signals in order to form therefrom at least four different logic functions in parallel. By means of such a series of four-pole circuits, the generation of a large number of logic functions is possible in an attractive manner.

Preferably, all control lines of a series of parallel-connected four-pole circuits are connected to each other and also to an output of a logic element, two inputs of which are suitable to receive two bivalent, variable input signals to be processed, it being possible to apply at least one of said signals also to the signal input line of a four-pole circuit of said series in order to from therefrom, and from the fixed signals "0" and "1", at least four different logic functions in parallel. This results in simple control of the formation of a very large number of feasible functions.

Preferably, said logic element is adapted to form an EXCLUSIVE-OR function, it being possible to apply exclusively one of said input signals to said series directly as well as via an inversion element. The formation of an EXCLUSIVE-OR function is simple, and so is the pattern of connections which can thus be realized.

Preferably, said series forms part of a row of correspondingly constructed series of successive significance levels, at least one signal output of a series being connected to a signal input of a series of next-higher significance level. Thus, an arithmetic and logic unit (ALU unit) can be attractively realized, said unit comprising a plurality of successive significance levels; the processing of two numbers consisting of a plurality of bit signals is thus simply possible.

Preferably, a four-pole circuit comprises a first current injector, an output of which is connected to a first draining element, the output of said draining element being connected in parallel to outputs of further draining elements which are controlled by signal input lines and which can be powered by current injectors, in order to control the respective output draining elements. This results in a four-pole circuit having a simple structure.

Preferably, said first current draining structure element comprises a current draining structure which is connected in one of its parallel-connected outputs and which is powered by a current injector, and which serves as an inverter circuit, its other output comprising a circuit for conduction in non-inverted form. Such an arrangement of four-pole circuits, composed exclusively of four successive layers, has a very reliable operation.

Preferably, said first current draining structure has an output connected in parallel to an output of a further current injector and to an input of a pnp circuit element which is serially connected in the circuit for transmission in non-inverted form and which is to be driven to conduction, said first current draining structure furthermore having an output directly connected to a second pnp circuit element which is serially connected to serve as an inverter circuit and which is to be driven to conduction. It has been found that this structure is very suitable to achieve an extremely compact construction on a semiconductor substrate.

A further attractive module is formed by a three-pole circuit for the formation of an EXCLUSIVE-OR function, said circuit comprising two input current draining structures which are to be powered by current injectors and which are controlled by relevant signal inputs, the first respective outputs of said current draining structures being connected to further current draining structures which are to be powered by current injectors, second respective outputs being connected to a first output current draining structure which is to be powered by a current injector, the outputs of the further current draining structures being connected to an input of a second output current draining structure which is to be powered by a current injector. It has been found that the latter can be realized with the described compact construction, so that it is suitable to form part of said library.

A further attractive three-pole circuit module produces a comparison function, and comprises two input current draining structures which are to be powered by current injectors and which are controlled by respective signal inputs, first respective outputs thereof being connected to further current draining structures which are to be powered by current injectors, said input current draining structures also comprising respective second outputs, one said second output of the one input current draining structure being connected, together with an output of the further current draining structure which is controlled by the other input current draining structure, to an input of a respective output current draining structure which is to be powered by a current injector. This module can again be realized with the same compact construction.

Furthermore, in the case of a four-pole circuit comprising a pnp transistor, a current injector for the power supply, constructed as a lateral structure, is preferably connected to a current draining structure which is constructed as a vertical npn transistor structure and which comprises a control input for a control signal, a p region of said current draining structure forming part of a pnp transistor to be powered and constructed as a lateral structure, there being provided a pnp structure which is connected parallel to said lateral current injector and which is connected directly to a supply line, the otherwise non-connected p electrode region thereof forming part of a lateral pnp structure, also connected parallel to said lateral pnp transistor, in order to support the conduction of current in said lateral transistor. Thus, the switching of said pnp transistor is more reliable and faster as a result of the additional p region which does not implement a logic function per se.

Preferably, the current injector, the lateral pnp transistor, and said two pnp structures form the relevant sides of a rectangle. This again results in a compact construction.

When said pnp transistor is used, a current injector which is constructed as a lateral structure is preferably connected for the purpose of power supply to a current draining structure which is constructed as a vertical npn transistor structure and which comprises a control input for a control signal, a p region thereof forming part of a lateral pnp transistor to be powered, a p region which is connected parallel to said lateral pnp transistor and which is otherwise non-connected being provided for supporting the current conduction of said lateral pnp transistor by charging by current from said current injector and the action of five successive layers of alternate p- and n-conductivity, said non-connected p region and the lateral pnp transistor constituting opposite sides of a rectangle. This additional p region also improves the switching properties.

The invention can be summarized as having two aspects. First of all, in view of their function, said four-pole circuits are very suitable for modular multiple or repeated use in a logic circuit as part of more complex functions. On the other hand, the function of the four-pole circuits is such that they can be realized in a form which is very suitable for computer aided design (CAD) of logic circuits.

BRIEF DESCRIPTION OF THE DRAWINGS

The invention will be described in detail hereinafter with reference to the drawings.

FIG. 10 shows a multi-output multiplexer module.

FIG. 11 shows a compact symbol thereof.

FIG. 12 shows three memory matricies organized according to the invention.

DESCRIPTION OF THE PREFERRED EMBODIMENTS

Figure 1:
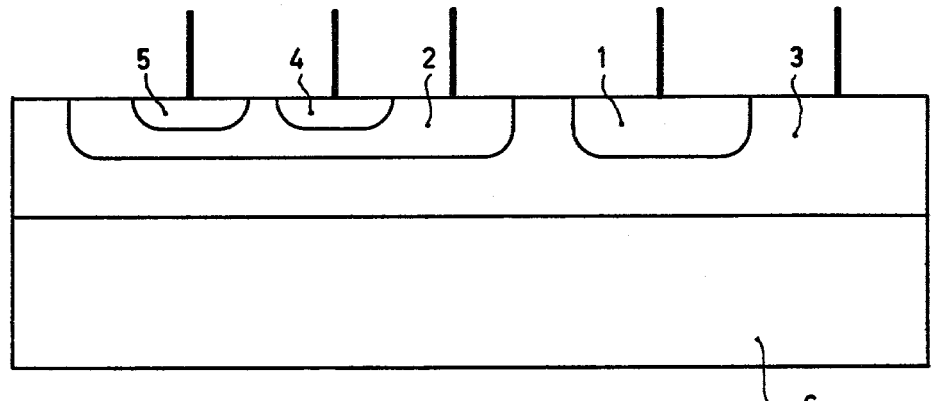
FIG. 1 is a sectional view of a multi-layer semiconductor structure in accordance with the technology used for the invention.

FIG. 1 is a sectional view of a semiconductor structure in which the circuit operates in accordance with the injection logic principle ($I^2L$). The structure comprises six layers which are manufactured by methods commonly used in semiconductor technology. Five layers are connected to conductors which may extend outside the semiconductor body and which are shown as heavy lines. Layer 1 is of a p-type material, connected to a supply source not shown, and constitutes an injecting layer. Layer 3 is of an n-type semiconductor material and is connected to ground potential in a manner not shown. Layer 3 forms an intermediate layer in which charge carriers are injected by the injecting layer. The hole current is determined by the supply voltage applied to layer 1 and also by the material properties such as the concentrations of impurities and the temperature. Layer 6 is made of an n-type semiconductor material having a higher n-concentration than layer 3. This layer acts as a mechanical reinforcement and may in given cases also be made of a material which acts as an insulator. Layer 2 is made of a p-type semiconductor material and constitutes a collector layer for the hole-current injected into layer 3 by layer 1. The assembly of layers 1, 2, 3 forms a three-layer current injector and has a lateral structure because the three layers are adjacently arranged. If layer 2 floats in an electrical sense, it is charged to a positive potential and also injects a hole current into layer 3, said hole current increasing as positive potential of layer 2 increases. Layer 1 and layer 2 are deposited together during the manufacturing process, so that their material properties substantially correspond. Because they are also situated very close to each other, they also have substantially the same temperature. As a result, they will also have substantially corresponding electrical properties. On the one hand, combination of the layer 1 and layer 3 may thus be considered as a current source having a high internal resistance which thus supplies a substantially constant current. On the other hand, the current which actually flows in the direction 1→3→2 depends on the potential of layer 2. If this potential is high, the current is small. If the potential of layer 2 is low, however, the current in the direction 1→3→2 is large.

The layers 4 and 5 are made of n-type semiconductor material and in this embodiment they constitute two collector electrodes of a multi-collector transistor which is thus formed by layers 3-2-4/5. If layer 2 is at a high potential, so that the current in the direction 2→3 is large (so that the current in the direction 1→3→2 is small), said transistor is conductive, so current can be conducted through layers 4 and/or 5. On the other hand, if the potential of layer 2 is made to be low by draining current therefrom by way of an external circuit (current in the direction 1→2→3 is large), said multicollector transistor is cut off. Thus, current controlled injection logic ($I^2L$) is obtained. Notably the structure of the current injector should not be considered as a pnp transistor, because only the currents are important and not the voltages. Therefore, two logic states may occur:

(a) no current is externally drained from layer 2, in which case currents flow in the directions 1→3 and 4/5→2→3.

(b) current is externally drained from layer 2, in which case current flows only in the direction 1→3→2. One of the two states may be defined as logic "1". The circuit can be modified by way of a different number of collectors.

Figure 2:
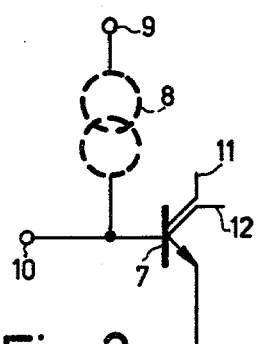
FIG. 2 shows diagrammatically an example of a gate module according to this technology.

FIG. 2 shows a gate constructed in integrated injection logic in the same manner as that shown in FIG. 1, be it that this gate is shown in symbolic notation. Transistor 7 is composed of layers 3, 2 and 4/5 of FIG. 1. Current source 8, denoted by a broken line and comprising the supply terminal 9, is composed of layers 1 and 3 of FIG. 1. Terminal 10 forms a signal input and collectors 11, 12 of transistor 7 form signal outputs. Transistor 7, therefore, can have two logic states:

(a) Current is drained from terminal 10 by an external circuit, so that the current conduction path between the emitter and collector electrodes of the transistor 7 is interrupted.

(b) No current is drained from terminal 10, so that the path between the emitter and collector electrodes can conduct. This structure can thus form a logic inverter.

Figure 3:
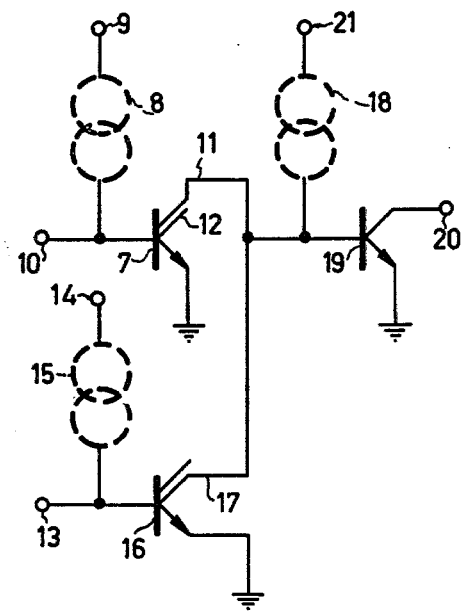
FIG. 3 shows an example of a further gate according to this technology.

FIG. 3 shows a circuit comprising three transistors 7, 16, 19 in accordance with the principle shown in FIG. 2, comprising signal terminals 10, 13, 20 and current sources 8, 15, 18, respectively, which always supply constant supply currents by way of a voltage applied to the terminals 9, 14, 21. If the current of source 8 is drained by an external connection to terminal 10, transistor 7 is cut off. The connection of the transistors 16 and 7 is the same. If the current of current source 18 is depleted to ground via the emitter 19 (instead of via the collector-emitter current path of transistor 7 or 16), the terminal 20 is conductively connected to ground via the collector-emitter current path of transistor 19. For this purpose it is necessary for a current to be drained from both terminals 10 and 13, because otherwise the current of the current source 18 is drained via transistor 7 or 16. The circuit can be described as follows: if electrode 11 and electrode 17 are both blocked, current source 18 cannot supply current thereto; this may be considered as a wired-AND-gate. The inversion by transistor 19 then results in a NAND-function between the circuit elements 11, 17 and 20; because the transistors 7 and 16 only have an inverting effect, the OR-function between the circuit elements 10, 13 and 20 is obtained.

Figure 4:
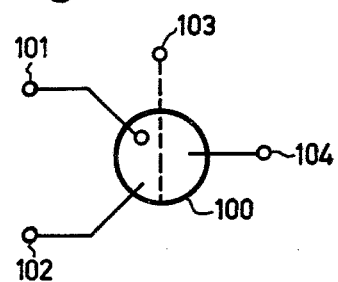
FIG. 4 shows a diagram of a four-pole circuit module in accordance with the invention.

FIG. 4 shows a diagram of a four-pole circuit module in accordance with the invention. Circuit 100 comprises two signal input lines 101, 102, a control line 103 which is denoted by an interrupted line, and a signal output line 104. In reaction to a first value (0) of the signal on the control line, the line 104 is connected to the line 101 (which is denoted by a circle); in reaction to a second value (1) of the signal on the control line, however, line 104 is connected to the second signal input line 102. In symbolic notation: 101 : Y0; 102 : Y1; 103 : X; 104 : Y. The following connections are established: if (X=0) then Y:Y0) else (Y:=1) This can be written in a formula as follows: Y(Y0, Y1)X.

It is to be noted that the notation shown in FIG. 4 is symbolic. The system aspects of the use of such four-pole circuits can be found in the application in integration at medium scale (MSI) or large scale (LSI) of circuit elements on one and the same substrate. In the case of such a set-up, the use of random access memories (RAM) and read only memories (ROM) steadily increases. RAM's are used primarily for the storage and transfer of data. ROM's are mainly used for the decoding of input signals and the formation of control logic. The transport of signals is always important. At the level of said four-pole circuit, a clear functional distinction exists between data signals (101, 102, 104) and control signals (103), so that there is logic at two levels (two-level logic). A circuit element of this kind is also useful for the formation of many logic and arithmetic functions between the bit signals of data words which are stored in two different word rows of random access memories.

The following is an example of the use of the circuit element in the case of positive logic: if Y0=1 and Y1=0, the function formed is: $Y = \overline{X}$, the stroke denoting the inverted value. If Y0=0, the function formed is: Y=X·Y1, the dot denoting the logic AND-function. Similarly, a multiple logic AND-gate can be formed by means of a cascade of such four-pole circuits. In a third example it is assumed that Y1=$\overline{Y0}$. In that case the function formed is: Y=X⊕Y0, the symbol ⊕ indicating the EXCLUSIVE-OR function. It is to be noted also that none of the signal terminals then has an undetermined signal state, which is an advantageous aspect.

Figure 5:
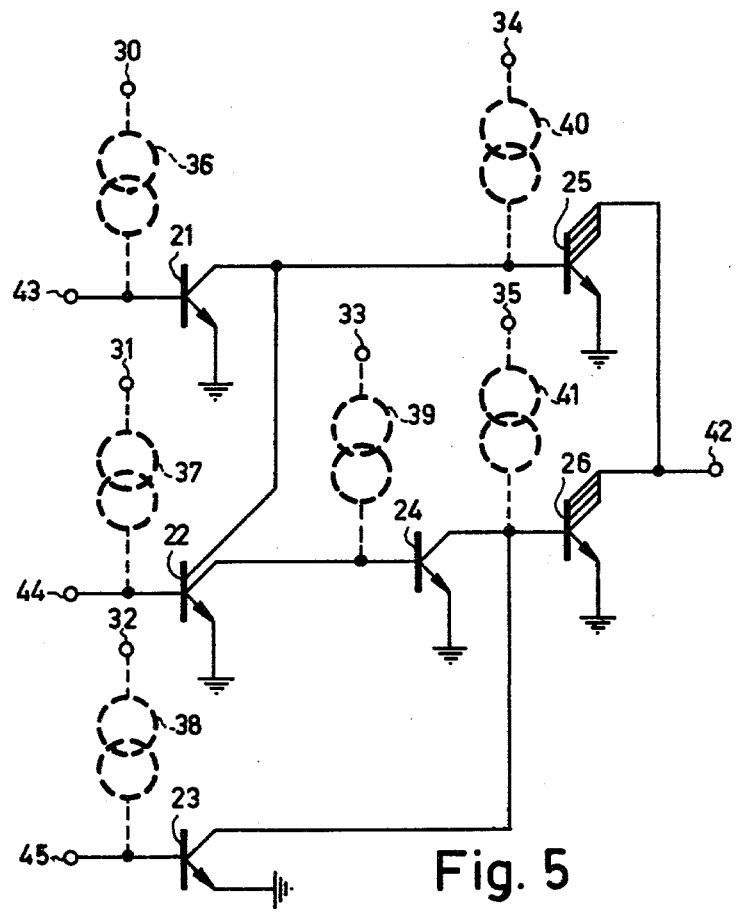
FIG. 5 shows an implementation thereof, based on the FIGS. 1-3.

FIG. 5 shows an implementation of the diagram of FIG. 4, comprising three signal input terminals 43, 44, 45, six supply terminals 30 through 35, six current source circuits 36 through 41 (denoted by broken lines), six transistors 21 through 26, and a signal output terminal 42. Terminal 44 of the signal input terminals is the control terminal. The supply terminals are connected to a supply source (not shown) of positive polarity as previously described.

If the terminal 44 is blocked (1), transistor 22 can conduct current from the current sources 39 and 40, so that transistors 24 and 25 are cut off and supply a signal which is defined as "1" in this context. Whether or not terminal 43 conducts is not important, because transistors 21 and 22 are connected in parallel. Transistor 24 acts, as described with reference to FIG. 2, as an inverter circuit. If the terminal 45 is blocked (1), the current of current source 41 is drained via transistor 23 and transistor 26 is cut off. Terminal 42 is then blocked or isolated from ground. However, if terminal 45 conducts, transistor 23 is cut off and transistor 26 conducts (0). If a logic "1" is present on terminal 44, the logic values of terminals 42 and 45 correspond.

However, if terminal 44 can drain current (logic 0), transistor 22 is cut off and transistor 24 conducts to drain the current of current source 41. The logic state of terminal 45 thus no longer has an effect, because transistor 26 is then cut off at all times. If terminal 44 is blocked (1), transistor 21 conducts the current of current source 40, and hence transistor 25 is cut off; output signal 1. If terminal 43 conducts, transistor 21 is cut off and transistor 25 conducts; output signal 0. If a logic "0" is present on terminal 44, the values of terminals 43 and 42 thus correspond. It is thus achieved that under the influence of each of the two values of the control signal (terminal 44), the output signal alternately follows the value of one of the two input signals, and hence is connected thereto. This need not imply a direct current through-connection. Transistors 25 and 26 and their current sources 40, 41 may form part of a next four-pole circuit and hence already form transistor/current source 21/36, 22/27 or 23/38 thereof. Transistors 25, 26 are shown to comprise quadruply interconnected collector electrodes in order to obtain a stronger signal (fan-out).

Figure 6:
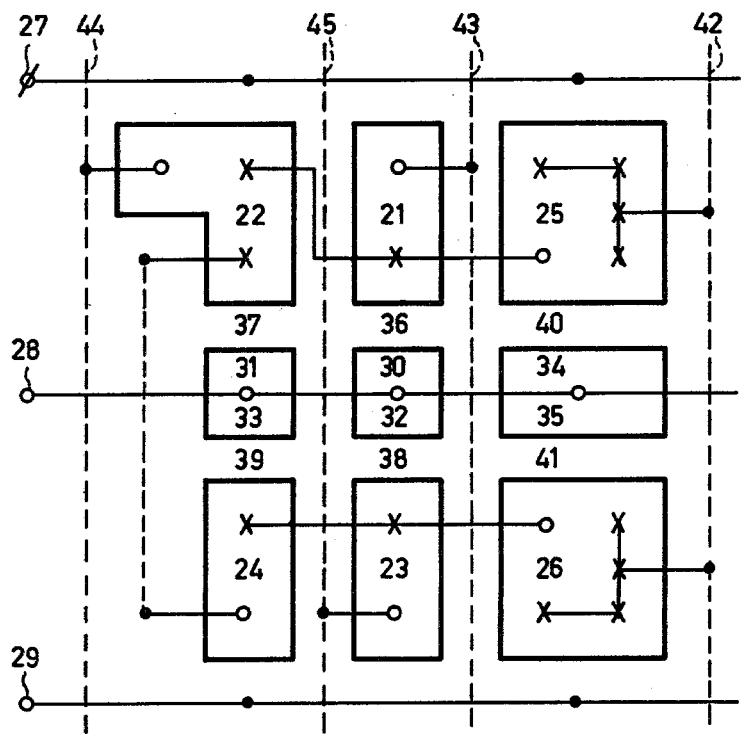
FIG. 6 shows a plan view of the regions on a semiconductor body of the implementation of FIG. 5.

FIG. 6 shows a partly diagrammatic implementation of the foregoing on a semiconductor body, the tolerances of the various regions not being shown completely to scale. Components are numbered partly in accordance with FIG. 5. The various manufacturing phases are realized in a conventional manner and will not be described herein. The design is realized with a two-layer wiring system, the conductors of which are made, for example, of aluminium and extend in the two coordinate directions. The wiring of the first layer is shown to be continuous and extends mainly from left to right in the Figure. The wiring of the second layer is denoted by a broken line for the purpose of distinction and extends in principle from the top downwards in the Figure. At the points of intersection they are insulated from each other by means of a silicon oxide layer, except when specially indicated. The four vertically extending lines successively conduct the control signal (44), the two data input signals (45, 43) and the data output signal. Line 43 is connected to structure 21 by a branch, a dot indicating a connection between the two wiring layers by way of a window in the layer which further insulates these two layers from each other. On the structure 21 a base connection by means of a direct contact is indicated by a circle. At this area a cross denotes a collector connection by means of an additionally provided n+-region. This collector is connected on the one side to a collector on structure 22, and on the other side to a base contact on structure 25 (these base contacts are, therefore, direct connections to the p blocks). A collector connection on structure 22 is connected, by a vertically shown connection, as a base contact to structure 24. Structures 24 and 23 have collector contacts connected to a base contact on the structure 26. The structures 25, 26 have, as has already been stated, a quadruple (four times as much surface area) collector contact connected to output line 42. The three central structures are connected parallel to supply line 28, while regions 36 through 41 form lateral current injectors. Terminals 27, 29 are connected to ground and connect the n-substrate to ground at the area of the connections shown. Thus, a four-pole circuit is formed. Lines 27, 28, 29, 42 through 45 may extend outside this circuit.

Figures 16, 17:
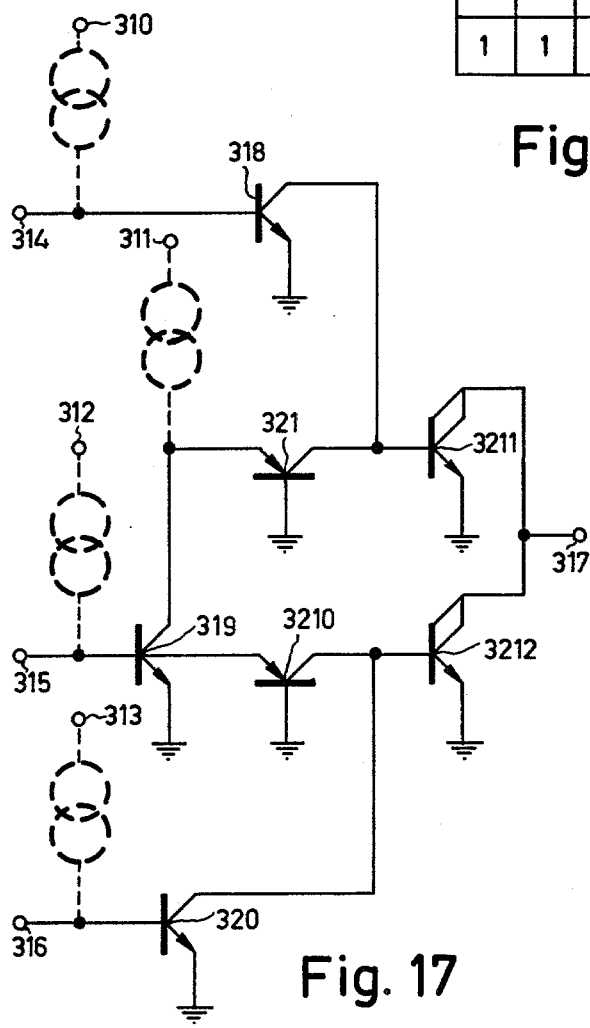
FIG. 16 shows the functions performed thereby under the control of the respective values of the control signals.
FIG. 17 shows a further embodiment of a four-pole circuit in accordance with the invention.

In this respect, FIG. 17 shows a further embodiment of a four-pole circuit in accordance with the invention. The terminals 310 through 313 are connected to a positive supply voltage for powering the associated current sources (not numbered). Structures 318, 319, 320 form the switching transistors which are constructed as inversely operating npn-elements, consisting of layers 5/4, 2 and 3 in accordance with FIG. 1. Structures 321, 3210 are constructed as lateral pnp transistors. Like before, in the case of a supply terminal 314, 315, 316 which is blocked for current discharge, the associated transistor 318, 319, 320 becomes conductive for a current which can be applied thereto via the collector electrode, under the influence of injection by the current sources connected to the relevant base electrodes. The transistors 3211, 3212 are output stage transistors which comprise, as in FIGS. 5, 6, an enlarged collector electrode (in this case 2x) in order to obtain an increased fan-out. If terminal 315 is blocked for current discharge (logic "1"), the base-emitter junction of structure 319 becomes conductive for the current of current source (injector) 312. As a result, the current of current source 311 can also be conducted to ground. In the first instance, in this situation transistor 321 no longer supplies current to the base electrode of structure 3211 or the collector electrode of structure 318. On the other hand, in the conductive state of structure 319, current is also injected into transistor 3210. The line which extends from left to right through structure 319 indicates that the base electrode thereof is interconnected. Thus, in this situation transistor 3210 supplies current to the base electrode of structure 3212, or to the collector electrode of the structure 320, respectively. In this condition, the logic value on terminal 314 is not important. If terminal 316 is blocked (1), structure 320 becomes conductive and structure 3212 is blocked for current draining via terminal 317. However, if terminal 316 is not blocked, structure 320 is blocked and structure 3212 becomes conductive. The logic values of terminals 316 and 317 then correspond. If terminal 315 conducts to drain current, structure 319 is blocked, like transistor 3210. The state of terminal 3216 thus has no effect. On the other hand, transistor 321 then becomes conductive, so that, due to the further symmetrical construction of the circuit, the logic states of terminals 314 and 317 correspond. FIG. 17 thus also shows a four-pole circuit within the scope of the invention.

Figure 18:
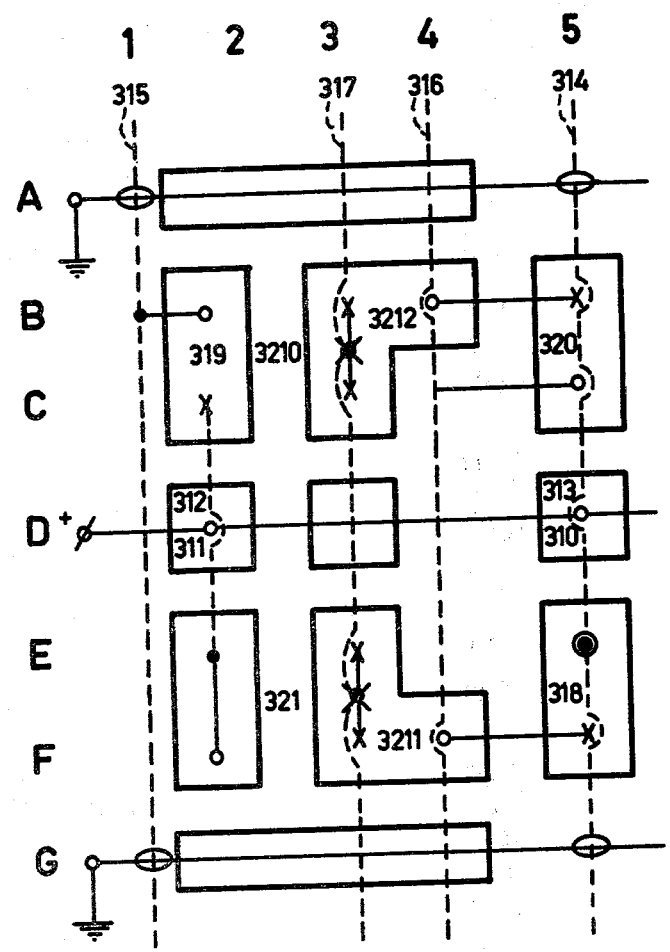
FIG. 18 shows a diagrammatic implementation thereof on a semiconductor body.

FIG. 18 shows, in the same semi-diagrammatic manner as FIG. 6, the implementation thereof on a semiconductor body, within spatially modular proportions of 5×7 pitches or elementary gradations. The columnwise pitches successively comprise connections for the control signal (terminal 315), a so-called inaccessible color which is reserved for internal connections and which, therefore, cannot comprise external signal connections, the output signal (terminal 317), and the two input signals (terminals 314, 316). The first row-wise pitch comprises an ground connection, like the seventh pitch which is a repeat of the first. The fourth pitch comprises a supply line which is to be connected to a positive supply source. The other four pitches are reserved for internal connections. Hereinafter, the notations commonly used for the game of chess are used for a position in the two-dimensional grid (see the indications on the sides). The position D2 contains the current source connections 312, 311, the position D5 contains the current source connections 313, 310 of the lateral current injectors. In these positions, there is no interconnection between the two wiring layers, which is diagrammatically denoted by a by-pass. In the positions A1, A5, G1, G5 ground connections are present; again no interconnections exist between the two wiring layers. In the positions B2, C2 there is provided a structure 319 which directly receives (circle) the control signal (line 315) via a branch. Thus, this concerns a vertically constructed transistor, a collector region of which (cross) is connected, via a second layer conductor (interrupted), a connection in the position 2, and a first layer conductor (continuous), to the structure 321 which is further powered by the lateral current source at 311. As is shown, the pnp transistors 321, 3210 have a lateral structure. The collector electrodes thereof comprise the multiple n+ collector regions of the vertical multi-collector structures 3212, 3211, respectively, which are connected to the signal output line by way of an internal parallel connection (see FIG. 6) and, by way of an interconnection, directly to the second wiring layer; this is denoted by a closed circle. The input signal on the line 316 is applied, via a branch, extending in the first conductor layer, to transistor structure 320. The input signal on the line 314 is applied from the second wiring layer directly to the transistor structure 318 which is also of the vertical type. These signals are not applied to further circuit elements, which is diagrammatically denoted in the relevant positions by a by-pass. A collector (n+) region of structures 318, 320 is connected to a p-region of structures 3211 and 3212, respectively. Said transistors 318, 320 are powered by current injectors connected to the position D5. The p-regions present in the positions A2, A3, A4, G2, G3, G4, D3 are not connected to external or internal signal connections and will be described hereinafter. The rows above row A and below row G can be used for signal lines between the various modules, while a next row of modules may be arranged thereabove or therebelow again. Circuit elements 310/318 and 313/320 cause an inversion. The omission of these elements implies, therefore, an inverted input signal. In practice, the respective signal input line 314/316 will then be directly connected to the p-base region of structures 3211 or 3212 instead of via a draining structure. Thus, a small modification of the cell results in a new function or element of the library.

Figure 19:
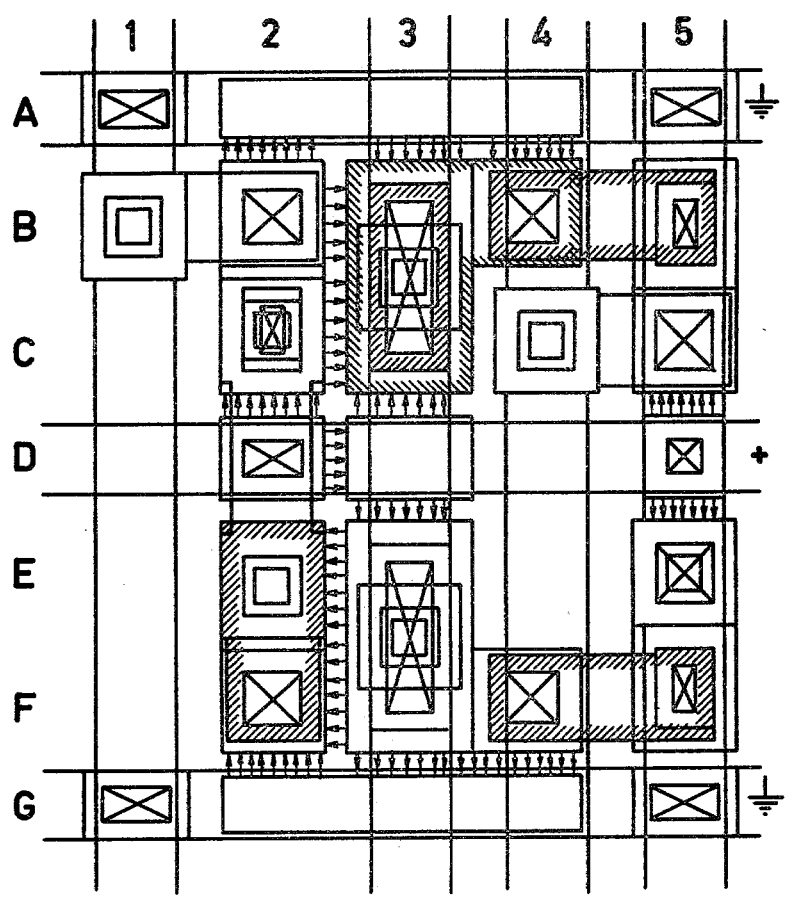
FIG. 19 shows an accurate implementation thereof on a semiconductor body.

FIG. 19 shows a more detailed execution on a pitch of 24 microns in both directions. The width of the vertically extending conductors is in principle 14 microns. It amounts to 12 microns for the horizontal conductors. In the position A1 there is provided a window of 6×12 microns in the insulating layer; this is indicated by a cross: this is the insulation between the first wiring layer and the substrate. The second layer conductor extends in non-connected form in the y-direction. Furthermore, there is also provided at this area an additional diffusion region, dimensioned 12×18 microns, in order to establish suitable contact (the width equals that of the horizontal conductor). The situations in the positions A5, G1 and G5 are identical. In position B1, each of the X- and Y-conductors is widened to form an overlapping region of 18×18 microns. These regions are interconnected by way of a window of 6×6 microns in the insulating intermediate layer, with a step transistion of 2 microns all around. Analogous structures are present in the positions E2 and C4.

Position B1 is connected, by way of a conductor having a width of 18 microns, to the position B2, said conductor being connected, through a window of 10×9 microns which is denoted by a cross, to the underlying p-region which has a rectangular shape of 18×40 microns. A corresponding connection is present in the position D2 (window 6×10 microns, o-region 14×18 microns), be it that at this area an y-conductor having a width of 14 microns extends in insulated form. A connection like that present in the position D2 is present in the position D5, be it that it is dimensioned 14×14 microns at the area of the p-region, while the window is dimensioned 6×6 microns; the insulated y-conductor also has a width of 14 microns. A corresponding connection is present in the position C5, be it that at this area the x-conductor has a width of 16 microns, the window being dimensioned 10×10 microns, and the p-region being dimensioned 18×40 microns. A corresponding connection is present in the positions B4, F4, the p-region locally having a width of 18 microns, the shadowed x-conductor having a width of 15 microns, and the window being dimensioned 10×9 microns. A connection of this kind is also present in the position F2, with a window of 9×10 microns, a rectangular p-region of 18×40 microns, and a partly shadowed y-conductor which is constructed between the positions E2 and F2 to a width of 16 microns (overall length 38 microns). The window is furthermore enclosed by an additional diffusion region of 18×18 microns in order to achieve better connection.

In the positions B5, F5 there are provided collector connections, by way of a window of 4×8 microns, and an n+ diffusion region of 10×14 microns in the p-body. A corresponding connection is present in the position C2, with a window of 4×8 microns and an n+ diffusion region of 10×14 microns. In this case the second-layer wiring is connected so that in the second insulating layer there is provided a window of 6×6 microns with a step transition of 10×10 microns, like in the positions B1, C4. As has already been stated, a multiple collector connection is present in the positions B3, C3. In this case the p-region, shadowed in the reverse manner, has a body of 22×40 microns in which there is situated an $n^{30}$ diffusion region of 14×32 microns which coincides with a shadowed first-layer conductor and which is interconnected by way of a window of 8×26 microns. Centrally thereon, the second-layer conductor is interconnected, as shown in the position B1, to the window and the step transition. A similar structure is also present in the positions E3, F3. The protrusion to the right of the L-shaped p-region is separated from the "body" by a vertical line. This line indicates a difference in the structure of the two parts of the p-region: the body is manufactured to be comparatively high-ohmic relative to the protrusion. A corresponding connection is also present in the position C2, be it that the n+ diffusion region thereof is dimensioned 10×14 microns and the associated window is dimensioned 4×8 microns. The connection of the second-layer conductor thereto is again in accordance with the pattern of position B1.

In the position E5 there is provided a connection similar to that in the position B1. However, a cross indicates that the connection is effected directly to the p-region: the y-conductor is again widened to form a region of 18×18 microns.

There is also additional p-regions at the areas A2, A4 (10×63 microns), G2, G3, G4 10×63 microns and D3 (12×22 microns). These additional regions serve to support the function of the pnp transistors 321, 3210 shown in the FIGS. 17 and 18. This is more clearly shown in FIG. 19 which indicates, by way of arrows, the currents in the case where the line 315 is blocked for draining current and hence only the logic state of line 316 is of importance. The effect of the logic state of line 314 is not shown. In FIG. 19 the current from the position D2 to the position C2/B2 and further parallel to the positions B3/C3 is assisted by a parallel connected current from the position D2 to C3 via D3. Similarly, said current is further assisted by a current from the position B2 to the position A2 and back from the position A3 to B3. In this case no current flows from the position D2 to the position E2/F2, because this current is drained on the opposite (upper) side. Said current to the position D3 is always present under the influence of the adjoining current source connection and flows in this case also to the positions E3/F3 and further to the positions E2/F2. The additional charge availability is advantageous for the switching of the lateral pnp structures, because the structures would otherwise have comparatively long switching times. A similar additional current to an otherwise non-connected p-region flows via the paths B2-A2-A3-B3 and (exactly oppositely directed) via F3-G3-G2-F2. The latter current is also adjunct to the current through the lateral pnp-transistors, but reverses its direction when the latter transistors switch. These currents also reduce the switching time. Therefore, this principle may be utilized in an inner position of a circuit if a lateral-vertical-lateral structure in integrated injection logic forms a corner in its sequence, so that a separate p-region of the rectangular structure may form a fourth corner. A further possibility is in that a vertical-lateral-vertical succession is present, a separate p-region then being deposited alongside the lateral central portion, thus forming a rectangular structure.

Figure 20:
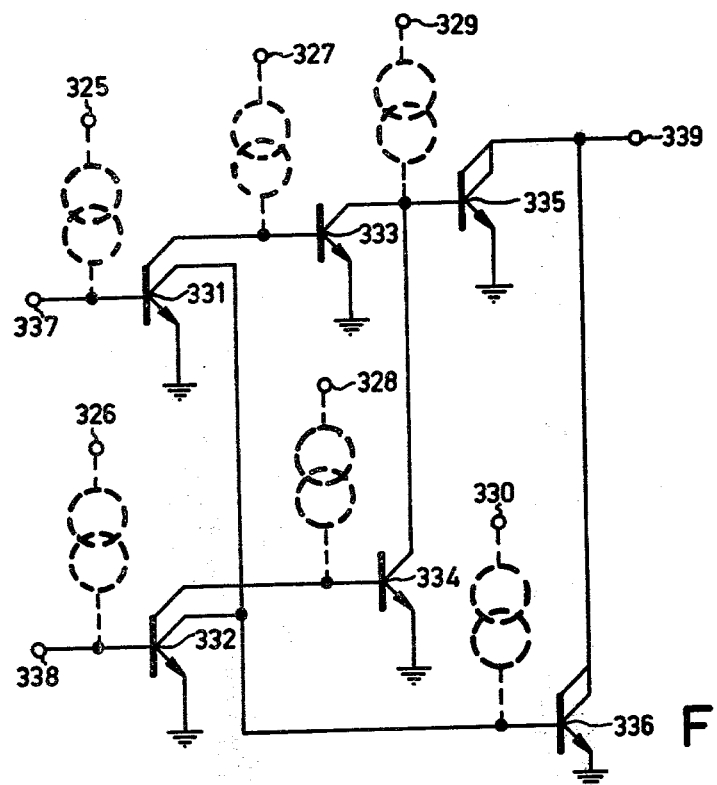
FIG. 20 shows a modification of FIG. 17 for the realization of other functions.

FIG. 20 shows a further circuit which, as will be demonstrated, can be realized within the same block of FIG. 19. The figure shows six I²L structures. The input signals appear on the terminals 337, 338. If terminal 337 is blocked for draining current, structure 331 is conductive and structure 336 is blocked. If terminal 338 can drain current, structure 332 is blocked, structure 334 is conductive and structure 335 is blocked. If terminal 337 can drain current, and terminal 338 is blocked for draining current, the ultimate situation will be indentical as a result of the symmetrical construction. If both input terminals are blocked, structures 331 conduct, structures 333, 334 are blocked and structure 335 conducts. Similarly, if both input terminals conduct, structure 336 conducts. If conductivity indicates a logic "0", this thus constitutes an EXCLUSIVE-OR circuit.

Figure 21:
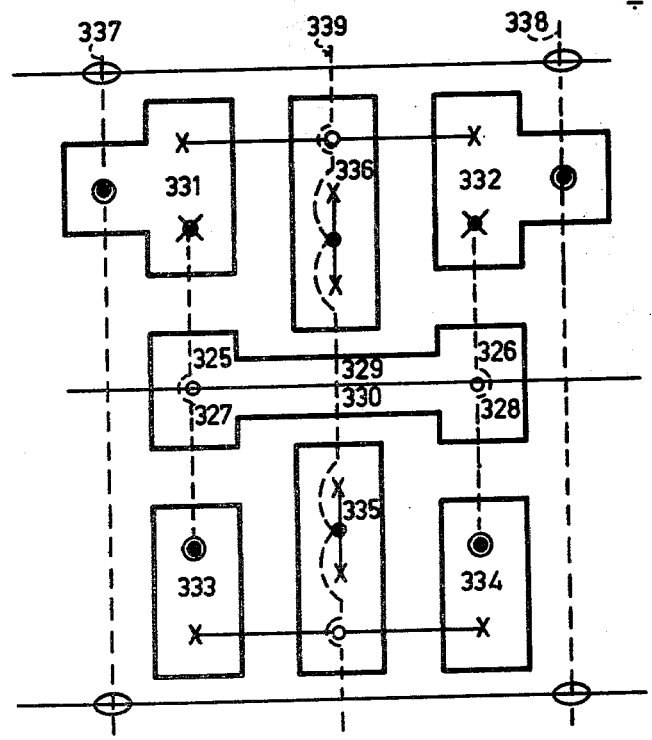
FIG. 21 shows a diagrammatic implementation thereof on a semiconductor body.

FIG. 21 shows an implementation thereof as a semiconductor structure within the same block as shown in FIG. 19. The columns concern the first input signal, which may be considered as serving as a control signal, an inhibit column, the output signal, a second inhibit column, and a second input signal, respectively. The circuit may be considered as if one of the two signal input lines (314, 316 of FIG. 18) were void in this case. The four-pole circuit having the EXCLUSIVE OR function in accordance with the foregoing is in this case realized in that inversions are effected, as is also shown in FIG. 2, within the circuit block. The supply line (positive) in the fourth row is connected in the second and fourth column to the central p-region (circles) in order to form the six current injectors denoted by the reference numerals 325 to 330 (the y-conductors are insulated at this area). Lines 337, 338 are connected to the p-regions 331 and 332, respectively, because the second wiring layer is directly connected (circle with dot). On each of these p-regions two collectors are present. The first pair (cross) is directly connected to p-region 336 which furthermore comprises two parallel-connected collectors which are connected to output line 339 (see also the structures 3211/3212 of FIG. 18). The second pair of collectors of structures 331/332 is connected to the second wiring layer (cross with dot) and the latter is connected to p-regions 333/334 without further contacts. Each of the latter comprises one collector which is parallel connected to structure 335 which is connected like 336. The first and the last row comprise ground lines again.

Figure 22:
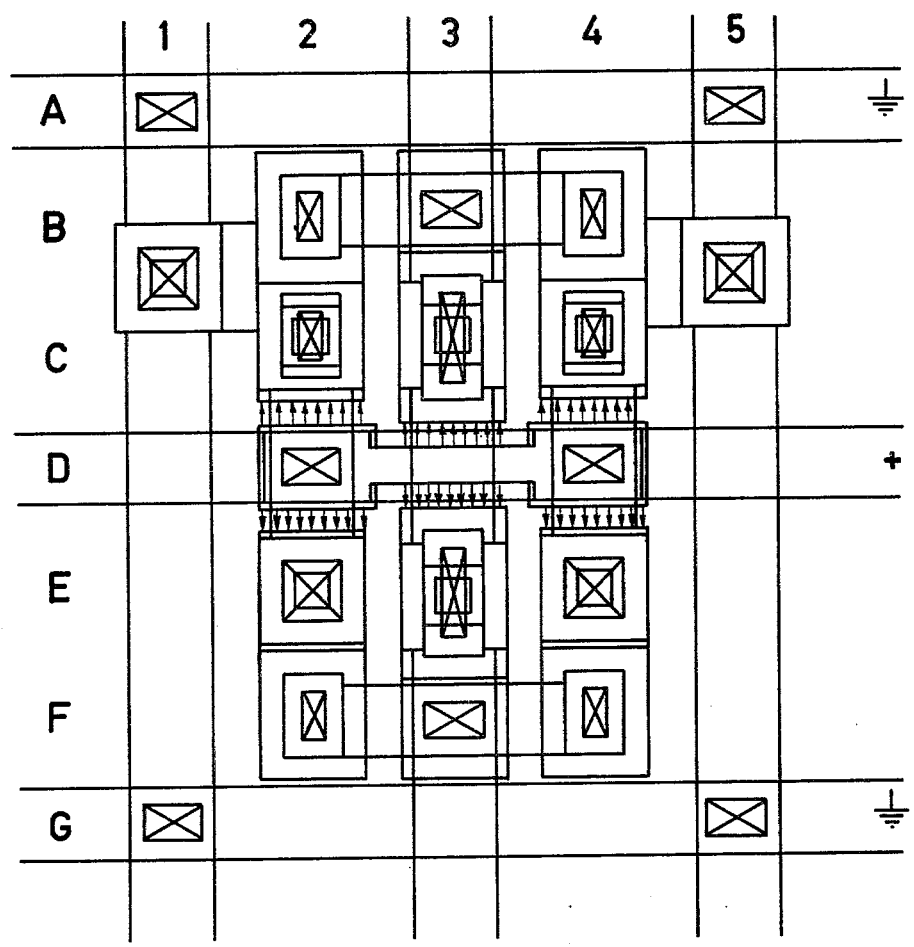
FIG. 22 shows an accurate implementation thereof on a semiconductor body.

FIG. 22 is a detailed view of the semiconductor structure in the same manner as FIG. 19, that is composed of the same cross point-elements which deviate therefrom only as regards their sequence and respective dimensions. This circuit again comprises five columns and seven rows, supply and ground lines being situated completely in the same positions, while the signal lines are also mainly situated in the same positions. The major differences between the three pole circuit and the already described four-pole circuit are as follows. In this embodiment there are no additional p-regions for assisting the (now absent) lateral pnp transistors. Instead, a p-region is situated between positions D2 and D4 and acts as a current injector. In view of space, the central portion (329, 330) is constructed to be narrower, while the current terminals are gathered in the positions D2, D4. The supply is thus bilateral and sufficient. The additional space thus created offers the possibility of proportioning the output draining elements to be larger, therefore an increased fan-out. Furthermore, the input signals are interstitially (BC1, BC5) supplied in order to obtain improved symmetrical connection of the input draining elements. Furthermore, the control line is of course absent. As a result of the mutually corresponding dimensions of the circuits shown in the FIGS. 18 and 21, they can be used many times in the same computer aided design.

The circuit shown in the FIGS. 20/22 can be readily modified to form a comparator which supplies a logic "1" only if the input signals correspond, and which otherwise supplies a "zero". To this end, the output of structure 334, for example, in FIG. 20 is connected to the base of structure 336 instead of to structure 335, and the collector output of structure 332 which does not lead to structure 334 is connected to the base of 335 instead of to the base of structure 336. In FIG. 21 this means, for example, that in the fourth column the second-layer conductor is directly connected to p-region 332, but as a collector to region 334; the region 334 is then also connected to signal input 333 instead of to region 332.

Figure 7:
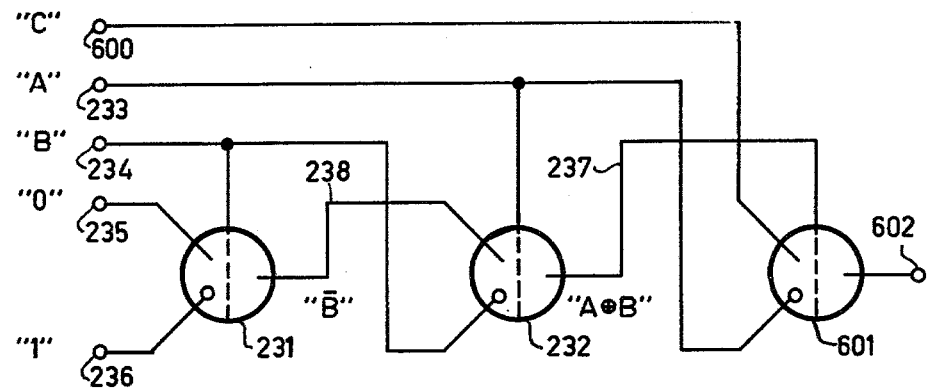
FIG. 7 shows a combination of four-pole circuit modules in accordance with the invention for implementing an inversion, an EXCLUSIVE-OR function and a majority function.

Hereinafter, the aspects of the invention at the system level will be described. FIG. 7 shows an assembly of three four-pole circuits in accordance with the invention in order to generate a majority signal D of three input signals A, B, C. This signal D can be represented in table as follows:

| A | 0 | 0 | 0 | 0 | 1 | 1 | 1 | 1 |
|---|---|---|---|---|---|---|---|---|
| B | 0 | 0 | 1 | 1 | 0 | 0 | 1 | 1 |
| C | 0 | 1 | 0 | 1 | 0 | 1 | 0 | 1 |

| -continued |   |   |   |   |   |   |   |   |
|---|---|---|---|---|---|---|---|---|
| D | 0 | 0 | 0 | 1 | 0 | 1 | 1 | 1 |

This can be written in words as follows: if $A \neq B$, $D=C$; if $A=B$, $D=A=B$. The four-pole circuit 231 receives the binary input signals "1" and "0", and the binary control signal B. If $B=1$, the output of the four-pole circuit 231 is connected to terminal 235 (0); if $B=0$, said output is connected to terminal 236 (1), so that the output indeed statically carries the inverted value $\bar{B}$ of B. The four-pole circuit 232 receives the binary input signals B and $\bar{B}$ and the binary control signal A. If $A=1$, line 237 is connected to line 238 and carries $\bar{B}$. If $A=0$, terminal 237 is connected to terminal 234 and carries B. If $A=B=1$ and if $A=B=0$, terminal 237 carries a binary "0" and otherwise it carries a binary 1, so that the EXCLUSIVE-OR function of $A \oplus B$ is realized. By utilizing such an assembly of two four-pole circuits, the use of a specific exclusive-or modification can be avoided. The required library of circuit elements is thus reduced at the expense of a slightly larger surface area. The four-pole circuit 601 is controlled by line 237. If $A \oplus B = 1$, terminal 602 is connected to terminal 600 which carries the signal C. If $A \oplus B = 0$ ($A=B$), terminal 602 receives the signal A from terminal 233.

Extension of majority logic to a plurality of input variables is also possible. In the case of four variables A, B, C, D and "majority of 1 signals", the table for the majority E is as follows:

| A | 0 0 0 0 0 0 0 0 1 1 1 1 1 1 1 1 |
|---|---|
| B | 0 0 0 0 1 1 1 1 0 0 0 0 1 1 1 1 |
| C | 0 0 1 1 0 0 1 1 0 0 1 1 0 0 1 1 |
| D | 0 1 0 1 0 1 0 1 0 1 0 1 0 1 0 1 |
| E | 0 0 0 1 0 1 1 1 0 1 1 1 1 1 1 1 |

A feasible formula is then: for $A=0$ and $B \neq C$, $E=D$; for $A=0$ and $B=C$, $E=B=C$; for $A=1$ and $B \neq C$, $E=A=1$, and for $A=1$ and $B=C$, E equals the majority of A, B, D. This formula can be readily implemented on the basis of FIG. 7.

Figure 8:
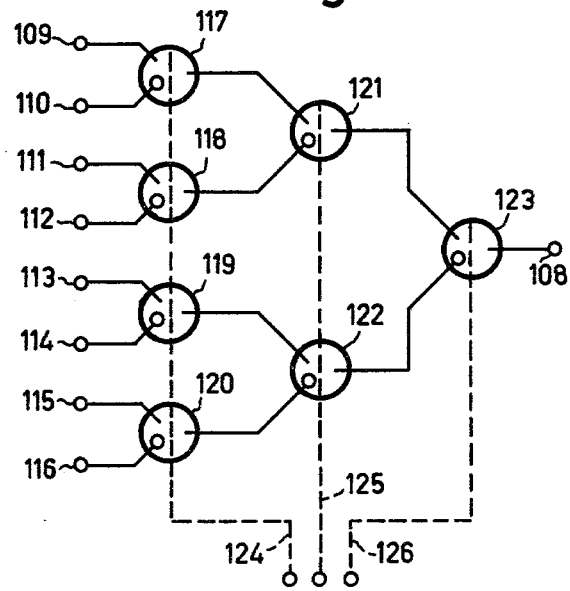
FIG. 8 shows a multi-input multiplexer module.

In this respect, FIG. 8 shows a multi-input multiplexer (MIM) comprising eight signal inputs 109 through 116, seven four-pole circuits 117 through 123 as shown in FIG. 4, three control lines 124 through 126, and an output terminal 108. Each of the eight possibilities for the combination of control signals connects a specific signal input to signal output 108.

Figure 9:
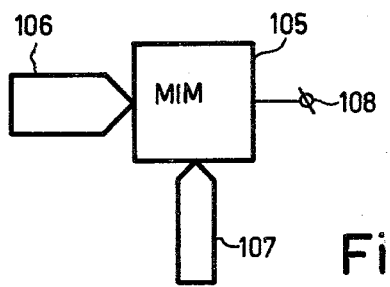
FIG. 9 shows a compact symbol thereof.

FIG. 9 shows a compact symbol for such a MIM circuit 105, comprising a multiple input line 106, a multiple control line 107, and a single output line 108.

Similarly, FIG. 10 shows a multi-output multiplexer (MOM), comprising a signal input 127, ten reference signal inputs 128 through 137 which are connected, for example, to the logic value "0", fourteen four-pole circuits 148 through 151 as shown in FIG. 4, three control lines 152 through 154, and eight output terminals 155 through 162. Each of the eight possibilities for the combination of control signals connects an own specific signal output to the signal input 127.

FIG. 11 shows a compact symbol for such an MOM circuit, comprising a single input line 127, a multiple control line 164, and a multiple output line 165.

In this respect FIG. 12 shows an assembly of three memory organizations, for example, each for a matrix of $8 \times 8$ bits. In this case six address bits are supplied along the address line 166, i.e. three for the multi-output multiplexer 167 which control the x-addressing with the simultaneous supply of a read/write control signal to the single terminal 176. The other three address bits are suitable for the y-addressing. The three x-address bits actuate one of the rows of the matrix 173, 174 or 175 (in practice, only a single matrix will be present). Under the control of the three y-address bits, one of the eight bits read in the matrix 173 is selected by the multi-input multiplexer 168 for further transport to the output 170. In the multiplexers 167, 168, the selection in three stages is denoted by broken lines. Thus, this forms a bit-organized memory of 64 words of one bit. The number of matrices 173 and multiplexers 168 may be increased as desired, in order to form longer words. The matrix 174 is addressed by a single y-address bit, so that in the four two-input multipliers 169 one bit is selected and a four-bit word appears on the outputs 171. The matrix 175 does not receive y-address bits, so that an eight-bit word appears on the output 172. The matrices 174, 175 may also have a multiple construction. Thus, a bit-organized memory, a word-organized memory or a hybrid form may be realized. The output lines of the matrices (input lines to the multiplexers 168, 169, or lines 172) can comprise one four-pole element as shown in FIG. 4 per junction, the signal input line 102, for example, then being connected to the data to be read, the line 101 being connected to the relevant output line, and the control line 103 being connected to the y-address line for this row of junctions.

Figure 13:
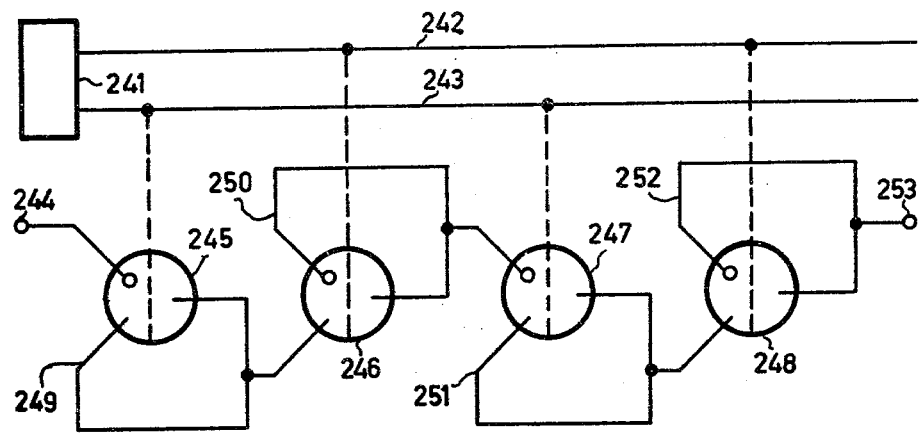
FIG. 13 shows the construction of a master-slave shift register module in accordance with the invention.

In this respect, FIG. 13 shows a shift register which is composed of four four-pole circuits 245 through 248 as described. The signal output line of these circuits is fed back, by a loop 249 through 252, to a signal input line. Binary input signals can arrive on the terminal 244. The clock pulse generator 241 can activate the clock pulse lines 242, 243. If a logic "0" appears on the clock pulse line 243, the terminal 244 is connected to the loop 249 by way of the output of the four-pole circuit 245. The input data are thus taken over. A corresponding situation occurs in four-pole circuit 247. If the line 243 becomes logic "1" again, loops 249 and 251 are coupled end-around and the hold state prevails. If subsequently line 242 becomes "1", data are taken over at the four-pole elements 246, 248. When line 242 becomes "0" again, the hold state again occurs. Lines 242, 243 may be embodied by the same conductor. Each two successive four-pole circuits thus form a master-slave flipflop, used to form the shift register. A shift register of this kind can be controlled in various manners: if line 243 is logic "0" and line 242 is logic "1" at the same time, the shift register can directly conduct with a comparatively small delay. Alternatively, a long shift register can be subdivided into parts with separate clock pule lines, so that the length of the shift register can be adapted without further modifications in the circuit being required.

Figure 14:
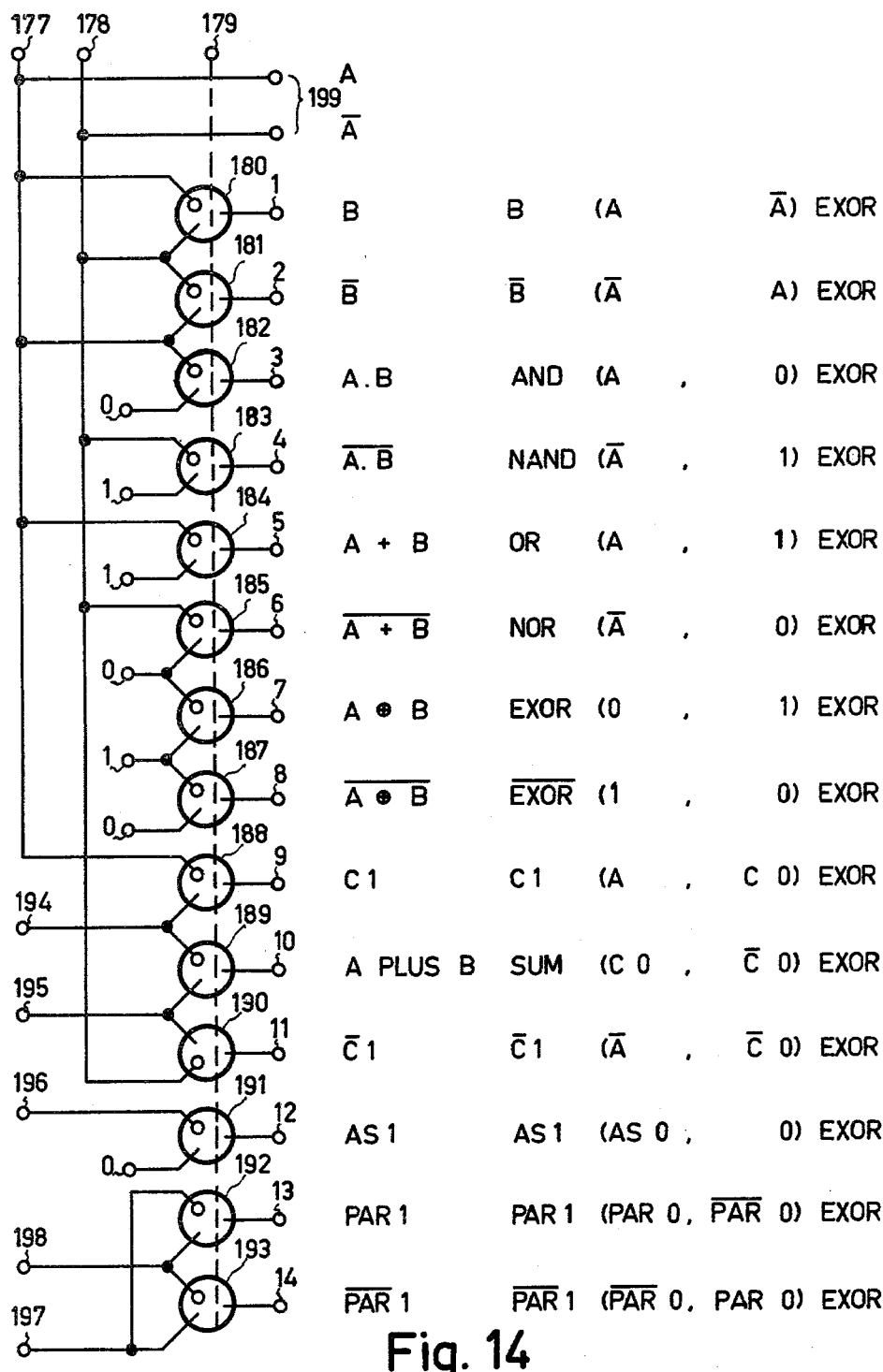
FIG. 14 shows a circuit module in accordance with the invention for the formation of logic functions.

In view of the foregoing, FIG. 14 shows a circuit for forming logic and arithmetic functions of two data bits. Two multi-bit words can be treated by combination of a number of such one-bit chips. The data bit of the first word is assumed to be A, while that of the second word is assumed to be B. First the exclusive-OR-function of these two bits is formed again: $C=A \oplus B$. The formation of the remaining logic functions is performed by means of fourteen circuit elements or modulus 180 through 193 in accordance with the invention, on the basis of a number of fixed input signals 0, 1, and eight input terminals 177 through 179, 194 through 198 which carry the following signals:

177: A
178: $\overline{A}$ (inverted value of A)
179: A ⊕ B
194: Co
195: $\overline{Co}$
196: ASo
197: PARo
198: $\overline{PARo}$ Initially, the quantities A and $\overline{A}$ are available again without further processing on the outputs 199. The quantity B is regenerated by the circuit element 180: if A⊕B=1, input 178 is interconnected ($\overline{A}$); if A⊕B=0, input 177 is interconnected. However, circuit element 181 regenerates $\overline{B}$: if A⊕B=0, input 178 is thus interconnected. Lines 1-14 show the formula notation stated with reference to FIG. 4. The circuit elements 182 through 185 form the AND- and OR-connections and their complementary values. The circuit elements 186 and 187 regenerate the function A⊕B and the inverted value thereof. This may be superfluous in given cases, because the signal A⊕B is already present on terminal 179. An additional advantage of the circuit shown may then be embodied in the exact correspondence as regards synchronization and logic signal levels of the outputs of various circuit elements 180 through 193. Similarly, for example, the signal A can also be generated by connecting both signal inputs of a further circuit element to terminal 177 and by connecting the control input terminal to terminal 179 (or an other signal).

On the basis of a received carry input signal Co, four-pole element 188 forms a carry output signal C1. If A=B=1, C1=A and hence equal to 1. If A=B=0, C1=0. If A≠B, C1=Co. The formation of such a carry output signal is thus simple. Similarly, circuit element 190 forms, on the basis of the inverted value of the carry input signal $\overline{Co}$, the inverted value of the carry output signal. Circuit element 189 forms the sum of A and B. This sum is equal to the input carry signal Co if A=B and equal to the inverted value of the input carry signal if A≠B. Similarly, the inverted value of the sum can be generated.

Circuit element 191 provides the generating of a bit signal on the basis of the comparison of two multi-bit data words. If A=B, AS1=ASo. This association bit propagates through the entire word only if all data bits of two words pair-wise correspond. This propagation may start at the least-significant data bit. At this area terminal 196 is then connected to a logic "1" signal (like circuit element 187). The propagation can also proceed in the other direction, and stops when the first pair of dissimilar data bits is detected.

Circuit element 192 generates a parity check on one of the two input words, for which purpose the other is made identical to (0 . . . 0). For example, if the signal PARo on terminal 197 has the value 0, ($\overline{PARo}$=1 on terminal 198) and the value of A⊕B=0 (so A=B=0), PAR1=0, so that the parity remains even without change. If in the same case A⊕B=1, (A≠B), PAR1=1, so that upon propagation of the signal PAR the parity of the entire multi-bit data word can be determined. Similarly, circuit element 193 generates the inverted parity signal. At the least-significant data bit, the signal on terminal 197 is to be made equal to zero and the signal on the terminal 198 is to be made equal to one. It is to be noted that the "1" and "0" signals can be supplied in two manners: first of all, as an external signal from a specific signal source which, for example, may be synchronized again, but the signals "0" and "1" may also be derived directly from the ground line or the supply line, respectively, of the cell which embodies the four-pole circuit. As a result, fewer external connections are required. If necessary, the cell can be internally adapted slightly for this purpose. The resultant increase of the number of cells in the library is usually not objectionable.

Figure 15:
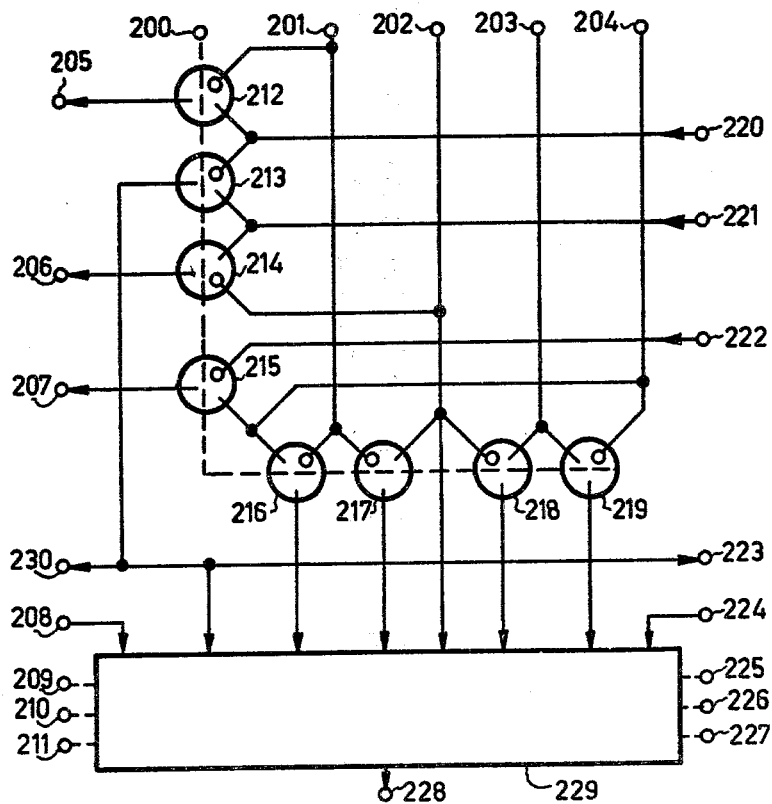
FIG. 15 shows a one-bit stage of an arithmetic and logic unit module constructed in accordance with the invention.

On the basis of the foregoing, FIG. 15 shows a one-bit chip of an arithmetric and logic unit obtained by a suitable choice from the functions formed. The input terminals carry the following signals, the values stated between brackets referring to the corresponding terminals of FIG. 14: 200 (179): A⊕B; 201 (177): A; 202 (178): $\overline{A}$; 203: 1; 204: 0; 220 (194): CO; 221 (195): $\overline{CO}$; 222 (196): ASo; 224: SUM 0; 208: SUM 2. The following eight connections are thus formed: 212 (188): C1; 213 (189): SUM 1; 214 (190) $\overline{C1}$; 215 (191): AS1; 216 (182): A.B; 217 (180): B; 218 (185): A+B; 219 (186): A⊕B. Element 229 is a multi-input multiplexer as shown in the FIGS. 8/9 and is operated by three control lines which may also be common to other one-bit stages of the multiplexer: 209/225; 210/226; 211/227. Thus, six logic relationships can be formed, together with two shift operations over one bit to the more-significant side as well as to the less-significant side, respectively (the latter is situated at the right in FIG. 15). For processing a word comprising N bits, the circuit shown in FIG. 15 must be present a corresponding number of times. Similarly, other logic connections can be chosen from FIG. 14.

FIG. 16 shows the functions which are performed by the circuit shown in FIG. 15 and which appear on output terminal 228 under the control of the various signal combinations on control terminals 209, 210, 211 of the multi-input multiplexer 229.

Figure 23:
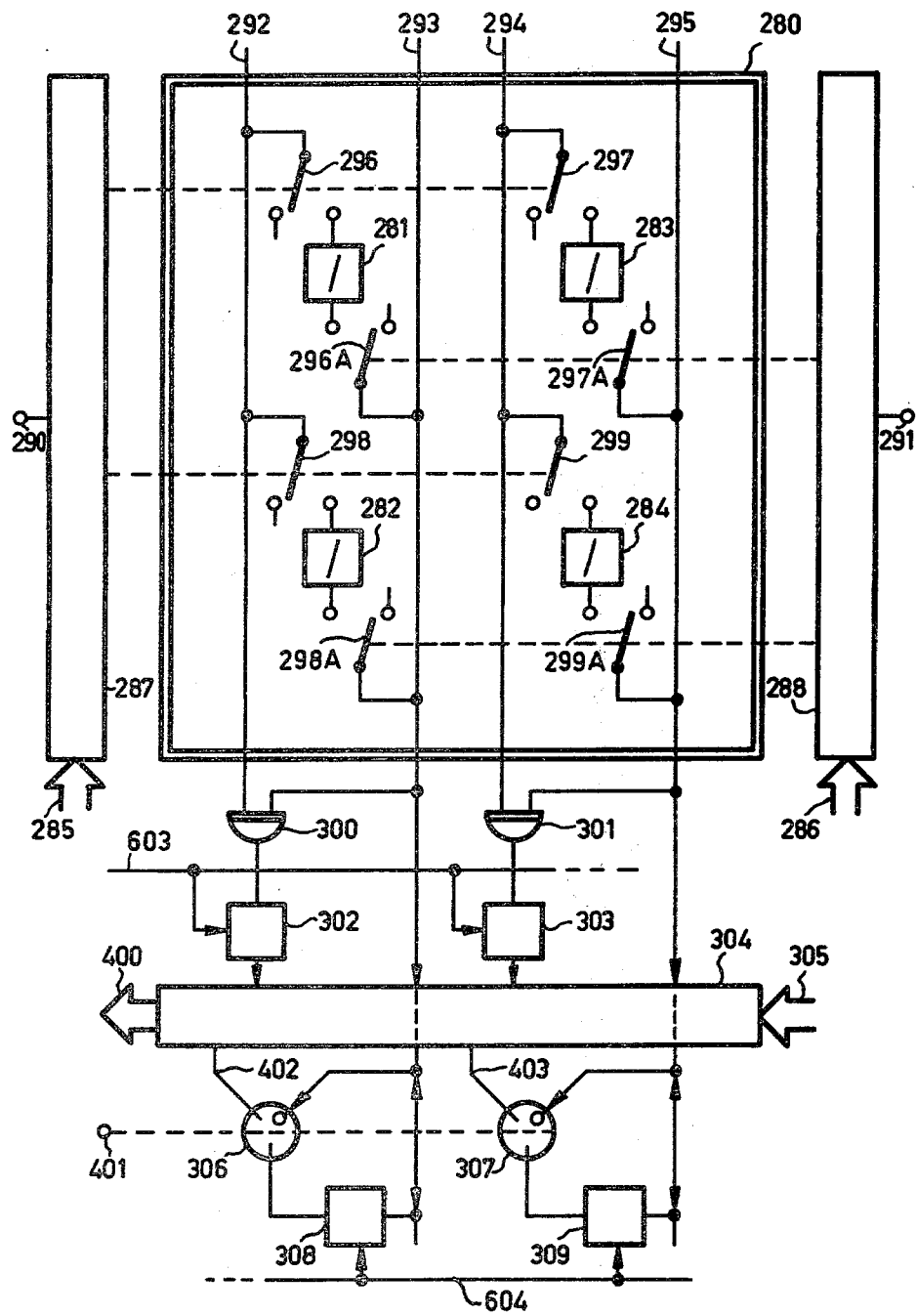
FIG. 23 shows a processor.

FIG. 23 shows a device for processing data signals in accordance with the invention. The assembly is organized around a random access memory and may, therefore, be referred to as a "Memory Oriented Processor" or MOP. For the sake of simplicity, only four memory bit positions 281 through 284 are shown; these may be conventional $I^2L$ memory cells. The memory matrix 280 has a double selection facility in that each of the multi-output multiplexers 287, 288 comprises multiple address inputs 285, 286, and also a selection control input 290, 291 for synchronization, it being possible for the signal to originate from a control device which is not shown for the sake of simplicity. The line pairs 292/294, 293/295 each time form a two-bit BUS-line which, in the case of appropriate control by the multi-output multiplexers 287/288, can receive the data of the bistable elements 281 through 284 via the switches 296 through 299, 296A through 299A. Said switches are connected to the outputs of the memory cells in one position. As is shown, the other position is such that no data are applied. Thus, two words of two bits can be simultaneously read for further processing. This 2×2 organization, obviously, is a very simple example. A storage capacity of, for example, 1K words of 16 bits may also be advantageous. The memory may then also be bit-organized. Lines 292 through 295 are connected to inputs of EXCLUSIVE-OR gates 300, 301 which may possibly be constructed in the manner already described, the output data thereof being temporarily retained in stages 302, 303 which are constructed as read amplifiers, and which are controlled for storage by an appropriate signal on the line 603. The BUS-line 293/295 continues (denoted by a dotted line) and reaches, via the four-pole circuit elements 306, 307, stages 308, 309 which are also constructed as read amplifiers for temporary storage of data. The storage in these stages can also be controlled by an additional signal on line 604. The signal on the control input 401 controls a read operation from memory 280 in this mode of operation. The data of element pairs 302/303 and 308/309 can be word-wise processed, as has already been stated, in the arithmetic and logic unit 304 which can also receive multi-bit control signals on input 305, again from the said control unit. The multiple input 305 can also be connected to a multiplexer which operates as a control decoder in order to select the correct data per bit position. The data thus formed are temporarily stored again, under the control of other one than the former signal value on the control input 401, via the data output lines 492, 403, in the circuit elements 308, 309 which thus also act as an accumulator register. The data in elements 308/309 can subsequently be stored in the memory 280, under the control of a rewrite signal on input 291 and appropriate address signals on multiple input 286 or be applied again, under the control of appropriate signals on multiple input 305, to the arithmetic and logic unit 304. Unit 304 also comprises a special multiple output 400 on which, after propagation of any carry signals over the width of the data word treated, special signalling or flag signals may appear. These signals concern, for example, a parity signal or an identity signal between two data words. A unit of the kind shown can also be constructed like the already described control unit. It will be obvious that further applications of the already described four-pole circuits are within the scope of the invention, i.e. the modular use of these circuits.

What is claimed is

1. An integrated circuit for processing of binary signals having a plurality of solid state four-pole circuits, each of said circuits comprising:
   a first signal input line for receiving a bivalent signal;
   a second signal input line for receiving a bivalent signal;
   a signal output line for outputting a bivalent signal;
   a control line for receiving a bivalent control signal for connecting alternatively a single one of said signal input lines to said signal output line;
   current injector means being provided for powering each of said signal input lines and said control line with injector current; and
   drain means being connected to said signal output line for draining an injector current.

2. An integrated circuit as claimed in claim 1 wherein at least two of said four-pole circuits are interconnected by at least one signal interconnection line.

3. An integrated circuit as claimed in claim 2 wherein said integrated circuit includes:
   at least three of said four-pole circuits;
   two of said three four-pole circuits having a signal input connection line being connected to a signal output connection line of the third four-pole circuit;
   said two four-pole circuits having their control lines interconnected but separate from the control line of said third four-pole circuit;
   said interconnections providing a multiplexer having two selection levels.

4. An integrated circuit as claimed in claim 1 wherein the signal output line of a first four-pole circuit is connected to the control line of a second four-pole circuit.

5. An integrated circuit as claimed in claim 4 further comprising:
   a circuit having three input signals;
   a circuit for forming an exclusive-OR function of two input signals;
   the signal of said exclusive-OR function controlling one of said four-pole circuits which receives on its signal input lines one of said two input signals and the third input signal respectively, for the formation of a majority circuit with respect to said three input signals.

6. An integrated circuit as claimed in claim 1 for the formation of a series shift register;
   at least two n of said four-pole circuits connected in series, wherein n is an integer;
   each of said four-pole circuits having its signal output line connected exclusively to one signal input line of itself and to one signal input line of the next four-pole circuit in said series;
   a control device for alternatively connecting the signal output line of the even and the odd four-pole circuits of said series to the signal output line of the preceding four-pole circuit of said series.

7. An integrated circuit as claimed in claim 1 further comprising:
   a series of parallel interconnected four-pole circuits;
   the control lines of each of said four-pole circuits being interconnected;
   the respective signal input lines of each of said four-pole circuits receiving at least three different logic signals in order to form therefrom at least four different logic functions in parallel.

8. An integrated circuit as claimed in claim 1 further comprising:
   a series of parallel connected four-pole circuits, having a common control line;
   a plurality of logic input signals being received on the signal input lines of said four-pole circuits from a logic circuit;
   the control lines of said series of parallel connected four-pole circuits being connected to receive a logic input signal from the output of said logical circuit;
   said logic input signals being received from a logical circuit having at least two inputs which are each suitable to receive two bivalent variable input signals for processing;
   at least one of said input signals of said logical circuit also being applied to a signal input line of a four-pole circuit of said series in order to form therefrom at least four different logic functions in parallel.

9. An integrated circuit as claimed in claim 8 wherein said logical circuit is an exclusive-OR function, one of its input signals being applied exclusively to said series of four-pole circuits directly and by inversion in an inverting circuit.

10. An integrated circuit as claimed in claim 9 wherein said series of parallel connected four-pole circuits forms part of a row of correspondingly constructed series of successive significance levels, at least one signal output of a series being connected to a signal input of a series of next higher significance level.

11. An integrated circuit as claimed in claim 1 wherein said four-pole circuit comprises:

a first current injector;

a first current draining structure;

an output of said first current injector being connected to said first current draining structure;

a plurality of further current draining structures having outputs;

the output of said first current draining structure being connected in parallel to outputs of said further current draining structures;

a plurality of signal input lines which control the draining of said current draining structures and which are powered by said current injectors thereby controlling the respective output current draining structures.

12. An integrated circuit as claimed in claim 11 wherein:

said first current draining structure is an npn current draining structure;

said npn current draining structure being constructed from three layers of a semiconductor;

said npn current draining structure being powered by a current injector;

said npn current draining structure serving as an inverter circuit;

said npn current draining structure being connected in a first one of its parallel connected outputs;

the second one of said parallel connected outputs of said npn current draining structure comprising a circuit for conduction in non-inverted form.

13. An integrated circuit as claimed in claim 11 further comprising:

at least one further current injector;

at least one pnp circuit element constructed from three layers;

an output of said first current draining structure connected in parallel to an output of a second current injector and to an input of a pnp circuit element;

said pnp circuit element being serially connected in said integrated circuit for conduction in a non-inverted form and which is to be driven to conduction;

said input current draining structures having respective second outputs;

one of said second outputs of one of said input current draining structures being connected together with an output of another current draining structure controlled by a third input current draining structure to an input of an output current draining structure powered by a current injector.

14. An integrated circuit as claimed in claim 1 comprising:

a current injector constructed as a lateral structure serving as a power supply;

a current draining structure constructed as a vertical npn transistor structure having a control input for a control signal;

said npn transistor being connected to said power supply;

a p region of said current draining structure forming part of a pnp transistor powered and constructed as a lateral structure;

a pnp structure which is connected parallel to said lateral current injector and which is connected directly to a supply line;

the non-connected p electrode region thereof forming part of a lateral pnp structure also connected in parallel to said lateral pnp transistor in order to support the conduction of current in said lateral transistor.

15. The integrated circuit as claimed in claim 14 wherein said current injector, said lateral pnp transistor and said two pnp structures form the respective sides of a rectangle.

16. The integrated circuit as claimed in claim 14 further comprising:

a current injector which is constructed as a lateral structure being connected for the purpose of power supply to a current draining structure which is constructed as a vertical npn transistor structure;

said vertical npn transistor structure comprising a control input for a control signal, a p region thereof forming part of a lateral pnp transistor to be powered, a p region which is connected parallel to said lateral pnp transistor and which otherwise is non-connected for supporting the current conduction of said lateral pnp transistor by charging with current from said current injector and the action of five successive layers of alternatively p and n conductivity, said non-connected p region and the lateral pnp transistor constituting the opposite sides of a rectangle.

17. An integrated circuit module for forming a logic function from two logical input signals comprising:

input means for each of said input signals;

each of said input means having respective current injectors and current draining means and having a first output and a second output;

inverting means for each of said input signals, said inverting means having respective current injectors and current draining means and each inverting means having an input connected to one of said first outputs, and having a third output;

two output means each having a current injector and a current draining means, each output means having a wired input for pair wise connection to said second and third outputs and each having a fourth output interconnected to a common output terminal.

18. An integrated circuit as claimed in claim 17 wherein said wired inputs are each connected to a second output and a third output for generating on an output terminal a compare signal between said logic signals.

19. An integrated circuit as claimed in claim 17, wherein the first of said wired inputs is connected to two second outputs and the second of said wired inputs is connected to two third outputs for generating on an output terminal an exclusive-OR function signal between said logic signals.

* * * * *